United States Patent [19]
Kramer et al.

[11] Patent Number: 5,973,949
[45] Date of Patent: Oct. 26, 1999

[54] INPUT STRUCTURE FOR ANALOG OR DIGITAL ASSOCIATIVE MEMORIES

[75] Inventors: Alan Kramer, Berkeley, Calif.; Roberto Canegallo, Tortona, Italy; Mauro Chinosi, Cologno Monzese, Italy; Giovanni Gozzini, Palazzolo Sull'Oglio, Italy; Pier Luigi Rolandi, Volpedo, Italy; Marco Sabatini, Brescia, Italy

[73] Assignee: STMicroelectronics S.r.l., Agrate Brianza, Italy

[21] Appl. No.: 08/941,879

[22] Filed: Sep. 30, 1997

[30] Foreign Application Priority Data

Sep. 30, 1996 [EP] European Pat. Off. ............. 96830497

[51] Int. Cl.⁶ .................................................. G11C 15/00
[52] U.S. Cl. ........................................ 365/49; 340/825.89
[58] Field of Search ........................ 365/49; 340/825.89, 340/825.87; 395/164

[56] References Cited

U.S. PATENT DOCUMENTS

| | | | |
|---|---|---|---|
| 3,934,231 | 1/1976 | Armstrong | 340/172.5 |
| 4,620,188 | 10/1986 | Sengchanh | 340/825.87 |
| 4,773,024 | 9/1988 | Faggin et al. | 364/513 |
| 4,785,299 | 11/1988 | Trumpp | 340/825.89 |
| 5,051,949 | 9/1991 | Young | 365/49 |
| 5,345,555 | 9/1994 | Providenza et al. | 395/164 |

FOREIGN PATENT DOCUMENTS 0 036 148  3/1981  European Pat. Off. .

OTHER PUBLICATIONS

A. Moopenn et al., "Programmable Synaptic Chip for Electronic Neural Networks," Neural Information Processing Systems, Denver, Colorado; pp. 564–572; 1988.

A. Kramer et al., "Ultra–Low–Power Analog Associative Memory Core Using Flash–EEPROM–Based Programmable Capacitors,"ISLPD '95 Symposium Proceedings; pp. 203–208, 1995.

*Primary Examiner*—David Nelms
*Assistant Examiner*—David Lam
*Attorney, Agent, or Firm*—David V. Carlson; Dennis M. de Guzman; Seed and Berry LLP

[57] ABSTRACT

An input structure for associative memories, including an array of elementary cells, a number of input lines, a number of output lines, a number of address lines, and a number of enable lines. Each elementary cell is formed by a D flip-flop having a data input coupled to one of the address lines and an enable input coupled to one of the enable lines, and by a switch coupled between an input line and an output line, and having a control input coupled to the output of a respective latch to selectively couple the respective input line and output line according to the data stored in the latch.

19 Claims, 1 Drawing Sheet ary lines 50 and an output Q. All the
INPUT STRUCTURE FOR ANALOG OR DIGITAL ASSOCIATIVE MEMORIES

TECHNICAL FIELD

The present invention relates to an input structure, in particular for analog or digital associative memories.

BACKGROUND OF THE INVENTION

As is known, for performing complex processing functions, associative memories with cells capable of memorizing a number of analog or digital multibit values are currently being studied, and for which use is advantageously made of nonvolatile floating-gate cells, particularly flash-EEPROMs, in which the value to be memorized is related to the threshold voltage of the cell. To read the cells, memorize the analog data and perform the processing operations, the cells must therefore be supplied through a specific input circuit with a number of appropriately memorized analog voltages.

According to one known solution (U.S. Pat. No. 4,232, 302), the input circuit comprises a sample-and-hold circuit having one input, N outputs and N+1 temporary storage paths and a control circuit that provides for cyclically coupling the input to the temporary storage paths to load all the analog input values sequentially on to the temporary storage paths and supply them cyclically to the output. In view of the time taken to load the analog voltages and supply them to the output, the above circuit is unsuitable for applications involving the storage and/or reading of a large number of multi level analog or digital signals.

SUMMARY OF THE INVENTION

It is an object of the present invention to provide a multiple-output input structure capable of supplying multi level analog or digital signals to a user device such as an analog or digital associative memory.

According to the present invention, there is provided an input structure, in particular for analog or digital associative memories.

In a first embodiment, the present invention includes a method for coupling one of a plurality of input lines to at least one of a plurality of output lines, in a circuit comprising a first plurality of address lines each coupled to a row of latch circuits and a first plurality of enable lines, each coupled to a column of the latch circuits. The method includes selecting one of the plurality of address lines, providing an address logic signal thereon, selecting one of the plurality of enable lines and providing an enable logic signal thereon. According to one embodiment, the method also includes changing a state of a latch circuit which has its respective inputs connected to the selected address line and the selected enable line in response to the address and enable logic signals and closing a switch coupled to an output of the latch circuit in response to the change in state of the latch circuit. The switch includes a first terminal coupled to an input line corresponding to the selected address line and a second terminal coupled to an output line corresponding to the selected enable line.

In a second embodiment, the invention includes a method for coupling one or more of a plurality of input lines to at least a first and a second of a plurality of output lines, in a circuit comprising an array of latch circuits arranged in rows and columns. Each of the first plurality of address lines are coupled to a row of latch circuits and each of a first plurality of enable lines are coupled to a column of the latch circuits.

The method includes selecting a first of the plurality of address lines, providing a first address logic signal thereon, selecting a first of the plurality of enable lines and providing a first enable logic signal thereon. The method may also include changing a state of a first latch circuit which has its respective inputs connected to the first address line and the first enable line in response to the first address and enable logic signals and closing a first switch coupled to an output of the first latch circuit in response to the change in state of the first latch circuit. The first switch includes a first terminal coupled to an input line corresponding to the first address line and a second terminal coupled to an output line corresponding to the first enable line.

In a further alternative embodiment, the method additionally includes selecting a second of the plurality of address lines, providing a second address logic signal thereon, selecting a second of the plurality of enable lines and providing a second enable logic signal thereon. The method further includes steps of changing a state of a second latch circuit which has its respective inputs connected to the second address line and the second enable line in response to the second address and enable logic signals and closing a second switch coupled to an output of the second latch circuit in response to the change in state of the second latch circuit. The second switch includes a first terminal coupled to a second input line corresponding to the second address line and a second terminal coupled to a second output line corresponding to the second enable line.

In one embodiment, the steps of closing the first and second switches are such that, for at least some period of time, the first analog input line is coupled to two different output lines simultaneously.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
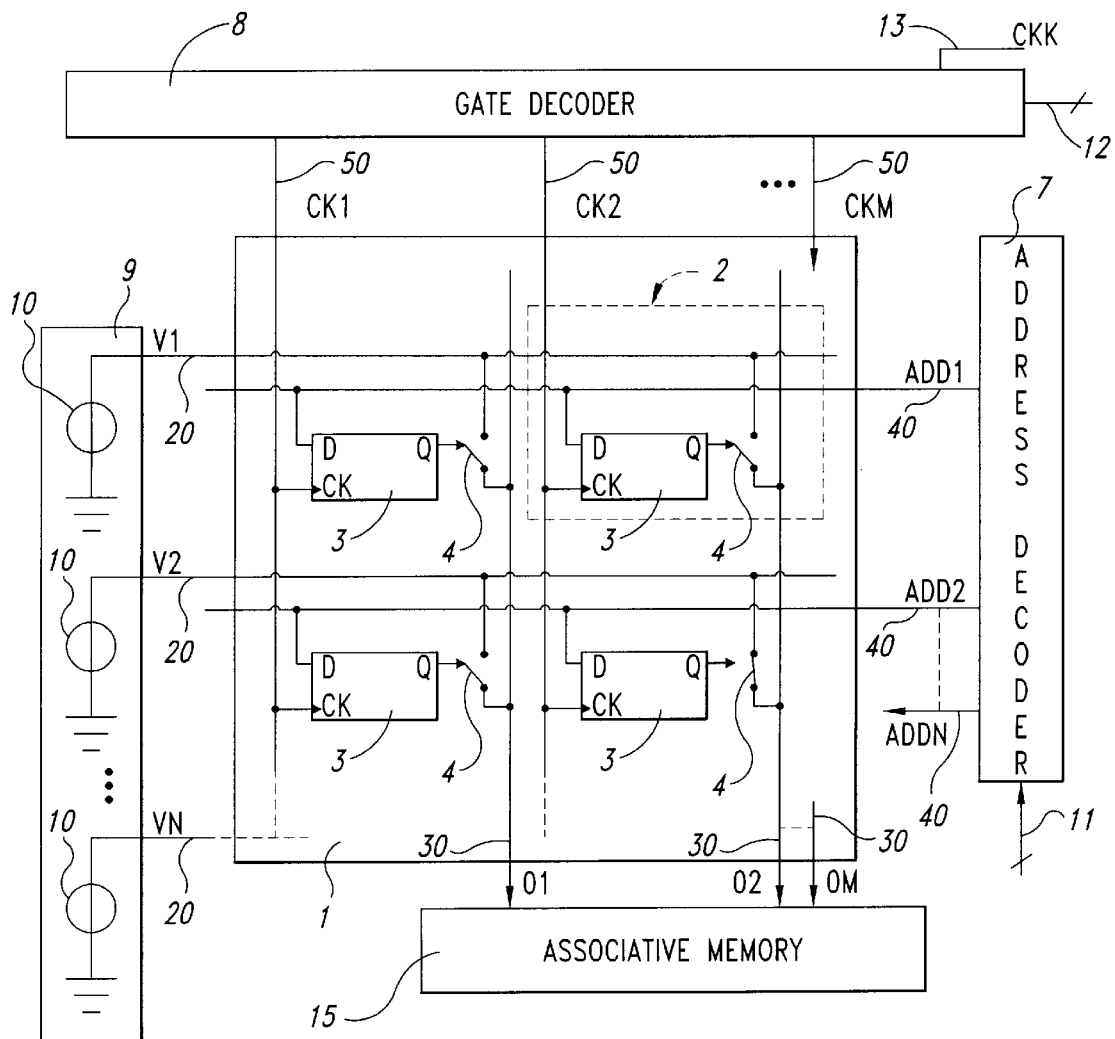
FIG. 1 is a simplified schematic diagram showing a multi level multiple-output voltage source featuring the input structure according to the present invention.

FIG. 1 shows a multi level voltage source 9 having a number of outputs—each supplying an analog or digital voltage selected from a number of values—and featuring the present input structure, indicated as a whole by 1. Structure 1 comprises a switching array in turn comprising N input lines 20; M output lines 30; a number of elementary cells 2 arranged in N rows and M columns; N address lines 40; and M enable lines 50. Input lines 20 and address lines 40 extend along the rows of matrix 1, output lines 30 and enable lines 50 extend along the columns of matrix 1, address lines 40 present signals ADD1, ADD2 . . . ADDN generated by an address decoder 7, enable lines 50 present enable signals CK1, CK2 . . . CKM generated by a gate decoder 8, the input lines present different analog input voltages V1, V2 . . . VN and the output lines 30 present different analog output voltages O1, O2 . . . OM.

Each elementary cell 2 comprises a latch 3 in the form of a D flip-flop and a switch 4. Each latch 3 has a data input D coupled to one of the address lines 40, an enable input CK coupled to one of enable lines 50 and an output Q. All the latches 3 of cells 2 in the same row are coupled to the same address line 40, all the latches 3 of cells 2 in the same column are coupled to the same enable line 50 and the output Q of each latch 3 is coupled to the control input of a respective switch 4.

Switches 4 (e.g., comprising CMOS devices for ensuring a high dynamic range) have a first terminal coupled to input lines 20 and a second terminal coupled to output lines 30. More specifically, the first terminals of switches 4 of cells 2 in the same row are coupled to the same input line 20 and the second terminals of switches 4 of cells 2 in the same column are coupled to the same output line 30.

As shown in FIG. 1, input lines 20 are coupled to a programmable multilevel voltage source 9 comprising a number of source circuits 10, each for generating a different programmable analog voltage and formed by any acceptable technique known in the art. One example is described in a co-pending patent application (U.S. application Ser. 08/941,880) filed concurrently and entitled "Programmable reference voltage source, particularly for analog memories." The circuit 9 supplies analog input voltages V1, V2 . . . VN and output lines 30 are coupled to an associative memory 15 of any known type.

Address decoder 7 is formed in a known manner, and comprises an input 11 supplied with a digital value specifying which of the N address lines is to assume a predetermined logic state (e.g., "1"). Gate decoder 8 is also formed in a known manner, and comprises an input 12 supplied with a digital value specifying which of the M enable lines is to assume a predetermined logic state (e.g., "1") and an input 13 receiving clock pulses CKM.

In structure 1, when one of analog input voltages V1–VN is to be supplied to one or more of output lines 30, address decoder 7 is supplied with the digital address of the row of cells 2 coupled to the input line 20 of the required voltage, and switches the corresponding address signal to logic level "1". Gate decoder 8 is supplied with the digital address of the column/s of cells 2 coupled to the output line/s 30 to be supplied with the required voltage, and, on receiving clock pulse CKM, supplies a "1" to the corresponding enable line or lines 50. The output can be provided sequentially, with only one address line 40 and one enable line 50 being valid at the same time. Alternatively, a plurality of enable lines 50 can be valid at the same time and one or more output line provided data so that the data on lines 30 is provided in parallel. The latch or latches 3 receiving two "1" at inputs D and CK switch the corresponding output Q to "1", thus closing the corresponding switch 4 and coupling the input line 20 of the required voltage to the selected output line 30. As the coupling request is stored inside the selected latch 3, the coupling remains the same even after termination of the enable pulse. Of course, the latch can be reset, disabled or switched to a different voltage by address and gate decoders 7, 8 when it is desired to change the outputs on line 30.

The switching array 1 is thus capable of coupling one input line 20 to one or more of the output lines O1 . . . OM simultaneously. The switching array 1 may be reset in one clock operation by setting all of the address lines 40 to a logic "0" and then strobing all of the enable lines 50 simultaneously, with the result that all of the switches 4 are left open and all of the output lines O1 . . . OM are left floating. The input lines may be set to a predetermined reference or reset potential as another reset option. Opening switches or coupling output lines to a reset potential may be effected by addressing specific switches or by simultaneously strobing the entire array.

In the example of FIG. 1, the switch at the intersection of ADD2 and CK2 is shown closed for illustration purposes. Of course, the opening and closing of the switches is controlled by the selection of the enable lines 50 and address lines 40, as has been explained.

Figure 2:
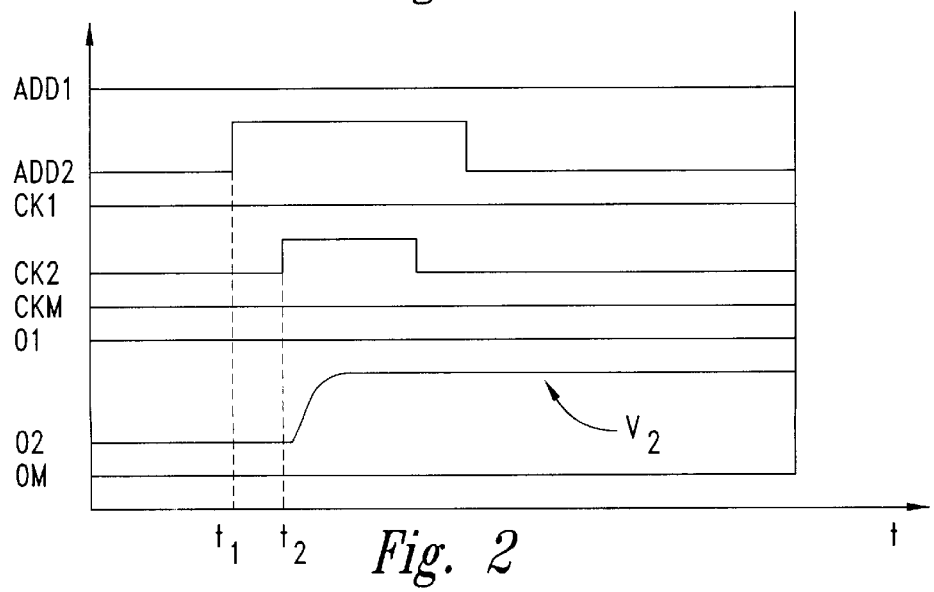
FIG. 2 is a timing diagram for a number of signals of the structure of FIG. 1.

By way of example, FIG. 2 is a timing diagram for supplying voltage V2 to the second output line 30 (output voltage O2). To begin with, switches 4 are all open, and the output lines and signals ADD1-ADDN, CK1-CKM are all floating. At instant $t_1$, signal ADD2 switches to 1; at instant $t_2$, signal CK2 also switches to 1, thus switching the latch 3 supplied with both the signals, and closing the respective switch 4; and, after a brief transient, voltage O2 reaches the value V2 present on the coupled input line, which situation remains unaffected even when signals CK2 and ADD2 are subsequently switched to zero.

Coupling data are normally loaded into cells 2 in direct-access manner by columns, at the maximum speed at which enable signals CK1-CKM are generated, and there are no analog limits to this speed. Each output line 30 may of course be coupled to only one input line, i.e., to only one analog input voltage, whereas the same input line may be coupled to and supply different output lines with the same analog voltage. Each output line may be left floating, or may be coupled to one of the various input lines without affecting the others.

The advantages of the structure described are as follows. In particular, by permitting direct access, different analog or digital voltage values may be supplied rapidly to a number of outputs, so that the structure is particularly suitable for use in devices employing different rapidly varying voltages, e.g., telephone answering machines comprising nonvolatile memories for storing voice samples. The voltages $V_1$, $V_2$–$V_n$ can be digital values in one embodiment. Moreover, the structure may be used as a digital/analog converter for supplying predetermined analog output voltages from the digital address data supplied to decoders 7, 8. The structure according to the present invention is also cheap and easy to integrate in complex electronic devices, and is highly flexible and reliable.

Clearly, changes may be made to the structure as described and illustrated herein without, however, departing from the scope of the present invention. In particular, the logic for addressing and selecting the elementary cells may be other than as described, latches 3 and switches 4 may be formed in any appropriate manner and any procedure may be employed for loading and modifying the switching data in latches 3.

What is claimed is:

1. An input structure for associative memories, the input structure comprising:

an array of elementary cells, a number of input lines, a number of output lines, and a number of address lines; each elementary cell comprising a memory element coupled to one of said address lines, and a switching element controlled by said each memory element to couple one of said input lines to one of said output lines, the array of elementary cells operable to simultaneously couple one of said input lines to a plurality of said output lines.

2. The structure as claimed in claim 1 wherein said elementary cells are arranged in rows and columns; and wherein each said switching element includes a first terminal coupled to one of said input lines, a second terminal coupled to one of said output lines, and a control terminal coupled to an output of a respective memory element.

3. The structure as claimed in claim 2 wherein said address lines comprise a number of address lines and a number of enable lines and each memory element comprises a first input coupled to one of said address lines, and a second input coupled to one of said enable lines.

4. The structure as claimed in claim 3 wherein said memory elements each comprise a latch.

5. The structure as claimed in claim 4 wherein said latch comprises a D flip-flop.

6. The structure as claimed in claim 5 wherein each said latch has a data input coupled to an address line, a clock input coupled to an enable line, and an output coupled to a control terminal of a respective switching element.

7. The structure as claimed in claim 6 wherein said address lines are coupled to a first decoder, and said enable lines are coupled to a second decoder; said first decoder including a digital input receiving a digital address signal specifying one of said address lines; and said second decoder including a clock input receiving a clock signal, and a digital input receiving a digital selection signal specifying one of said enable lines.

8. The structure as claimed in claim 7 wherein said input lines are coupled to a multiple-output analog voltage source.

9. A method comprising:
   selecting one of a plurality of address lines corresponding to a respective input line of a memory and providing an address logic signal thereon, while the respective input line is coupled to a selected one of a plurality of output lines coupled to the memory;
   selecting one of a plurality of enable lines corresponding to another of said plurality of output lines and providing an enable logic signal thereon;
   changing a state of a latch circuit which has respective inputs connected to said selected address line and said selected enable line in response to said address and enable logic signals; and
   closing a switch coupled to an output of said latch circuit in response to said change in state of said latch circuit to simultaneously couple the respective input line to said another output line while the respective input line is coupled to the selected one of the plurality of output lines.

10. The method according to claim 9 wherein said switch includes a first terminal coupled to an input line corresponding to said selected address line and a second terminal coupled to an output line corresponding to said selected enable line.

11. The method as claimed in claim 9 wherein:
   changing a state of a latch circuit includes changing a state of a D flip flop located at a juncture of said selected address line and said selected enable line in response to said address and enable logic signals; and
   closing a switch includes closing a switch coupled to an output of said D flip flop in response to said change in state of said D flip flop, wherein said switch includes a first terminal coupled to an input line corresponding to said selected address line and a second terminal coupled to an output line corresponding to said selected enable line.

12. The method as claimed in claim 9 wherein closing a switch includes turning on a MOSFET having a gate coupled to an output of said latch circuit, wherein said MOSFET includes a first terminal coupled to an input line corresponding to said selected address line and a second terminal coupled to an output line corresponding to said selected enable line.

13. The method as claimed in claim 9 wherein changing a state of a latch circuit includes changing a state of a D flip flop having a clock input coupled to said selected address line and a data input coupled to said selected enable line in response to said address and enable logic signals.

14. The method as claimed in claim 13 wherein each of said plurality of address lines are coupled to a first decoder, and said each of said plurality of enable lines are coupled to a second decoder, said method further including:
   receiving a digital address signal specifying one of said plurality of address lines at a digital input to said first decoder and providing said address logic signal on said selected address line in response thereto; and
   receiving a clock signal at a clock input of said second decoder and receiving a digital selection signal at a digital input of said second decoder, said digital selection signal specifying one of said plurality of enable lines and providing said enable logic signal in response thereto.

15. A method comprising:
   selecting a first of a plurality of address lines and providing a first address logic signal thereon;
   selecting a first of a plurality of enable lines and providing a first enable logic signal thereon;
   changing a state of a first latch circuit which has respective inputs connected to said first address line and said first enable line in response to said first address and enable logic signals;
   closing a first switch coupled to an output of said first latch circuit in response to said change in state of said first latch circuit, wherein said first switch includes a first terminal coupled to an input line corresponding to said first address line and a second terminal coupled to an output line corresponding to said first enable line, wherein closing said first switch couples said input line corresponding to said first address line to said output line corresponding to said first enable line;
   selecting a second of said plurality of address lines and providing a second address logic signal thereon;
   selecting a second of said plurality of enable lines and providing a second enable logic signal thereon;
   changing a state of a second latch circuit which has respective inputs connected to said second address line and said second enable line in response to said second address and enable logic signals; and
   closing a second switch coupled to an output of said second latch circuit in response to said change in state of said second latch circuit, wherein said second switch includes a first terminal coupled to a second input line corresponding to said second address line and a second terminal coupled to a second output line corresponding to said second enable line, while the first switch is closed, to simultaneously couple said second input line corresponding to said second address line to said second output line corresponding to said second enable line.

16. The method as claimed in claim 15 wherein:
   changing a state of a first latch circuit includes changing a state of a first D flip flop located at a juncture of said first address line and said first enable line in response to said first address and enable logic signals;
   closing a first switch includes closing a first switch coupled to an output of said first D flip flop in response to said change in state of said first D flip flop, wherein said first switch includes a first terminal coupled to an input line corresponding to said first address line and a second terminal coupled to a first output line corresponding to said first enable line;

changing a state of a second latch circuit includes changing a state of a second D flip flop located at a juncture of said second address line and said second enable line in response to said second address and enable logic signals; and closing a second switch includes closing a second switch coupled to an output of said second D flip flop in response to said change in state of said second D flip flop, wherein said second switch includes a first terminal coupled to a second input line corresponding to said second address line and a second terminal coupled to a second output line corresponding to said second enable line.

17. The method as claimed in claim 15 wherein:

closing a first switch includes turning on a first MOSFET having a gate coupled to an output of said first latch circuit, wherein said first MOSFET includes a first terminal coupled to a first analog input line corresponding to said first address line and a second terminal coupled to a first output line corresponding to said first enable line; and closing a second switch includes turning on a second MOSFET having a gate coupled to an output of said second latch circuit, wherein said second MOSFET includes a first terminal coupled to a second analog input line corresponding to said second address line and a second terminal coupled to a second output line corresponding to said second enable line.

18. The method as claimed in claim 15 wherein said address lines are coupled to a first decoder and said enable lines are coupled to a second decoder, said method further including:

receiving a first digital address signal specifying a first address line of said plurality of address lines at a digital input to said first decoder and providing said first address logic signal on said first address line in response thereto;

receiving a clock signal at a clock input of said second decoder and receiving a first digital selection signal at a digital input of said second decoder, said first digital selection signal specifying a first of said plurality of enable lines and providing said first enable logic signal in response thereto;

receiving a second digital address signal specifying a second address line of said plurality of address lines at said digital input to said first decoder and providing said second address logic signal on said second address line in response thereto; and receiving a clock signal at said clock input of said second decoder and receiving a second digital selection signal at said digital input of said second decoder, said second digital selection signal specifying a second of said plurality of enable lines and providing said second enable logic signal in response thereto.

19. The method as claimed in claim 15 wherein:

closing a first switch includes turning on a first MOSFET having a gate coupled to an output of said first latch circuit, wherein said first MOSFET includes a first terminal coupled to a first analog input line corresponding to said first address line and a second terminal coupled to a first output line corresponding to said first enable line; and closing a second switch includes turning on a second MOSFET having a gate coupled to an output of said second latch circuit, wherein said second MOSFET includes a first terminal coupled to said first analog input line and a second terminal coupled to a second output line corresponding to said second enable line, such that, for at least some period of time, said first analog input line is coupled to two different output lines simultaneously.

* * * * *